United States Patent
Hirotsuru et al.

(10) Patent No.: US 9,524,918 B2
(45) Date of Patent: Dec. 20, 2016

(54) HEAT DISSIPATING COMPONENT FOR SEMICONDUCTOR ELEMENT

(75) Inventors: Hideki Hirotsuru, Fukuoka (JP);
Hideo Tsukamoto, Fukuoka (JP);
Yosuke Ishihara, Fukuoka (JP)

(73) Assignee: DENKA COMPANY LIMITED, Tokyo (JP)

( * ) Notice: Subject to any disclaimer, the term of this patent is extended or adjusted under 35 U.S.C. 154(b) by 320 days.

(21) Appl. No.: 14/235,533

(22) PCT Filed: Jul. 17, 2012

(86) PCT No.: PCT/JP2012/068130
§ 371 (c)(1),
(2), (4) Date: Jan. 28, 2014

(87) PCT Pub. No.: WO2013/015158
PCT Pub. Date: Jan. 31, 2013

(65) Prior Publication Data
US 2014/0182824 A1    Jul. 3, 2014

(30) Foreign Application Priority Data

Jul. 28, 2011  (JP) ................................ 2011-165009

(51) Int. Cl.
*H01L 23/373*  (2006.01)
*C25D 5/12*  (2006.01)
(Continued)

(52) U.S. Cl.
CPC ........... *H01L 23/3735* (2013.01); *B22D 18/02* (2013.01); *B22F 7/08* (2013.01); *B32B 15/016* (2013.01);
(Continued)

(58) Field of Classification Search
CPC ............... C25D 5/12; C25D 5/50; C25D 7/00; C23C 18/1653; H01L 23/3732; H01L 2924/0002; H01L 23/3735; B32B 15/016; C22C 21/00; C22C 45/04; C22C 26/00; B22F 7/08; F28F 3/00; B22D 18/02
See application file for complete search history.

(56) References Cited

U.S. PATENT DOCUMENTS

2011/0123821 A1    5/2011  Hirotsuru
2012/0039014 A1*   2/2012  Ogawa .................. H01G 4/005
                                                              361/301.4

FOREIGN PATENT DOCUMENTS

EP      2305400 A1      4/2011
JP      07-007243  *    1/1995  ............... H05K 3/24
(Continued)

OTHER PUBLICATIONS

English translation of JP 2012-158817 provided by the JPO website, internet retrieval date of Mar. 20, 2016.*
(Continued)

*Primary Examiner* — Jonathan Langman
(74) *Attorney, Agent, or Firm* — Pearne & Gordon LLP

(57) ABSTRACT

Disclosed is a heat dissipating component for a semiconductor element, having a tabular body 0.4-6 mm in thickness containing 40-70 volume % of diamond particles, with the balance comprising metal of which the principal component is aluminum, and coated on both surfaces by a coating layer comprising metal of which the principal component is aluminum, or an aluminum-ceramic based composite material, to form an aluminum-diamond based composite body. On at least the two major surfaces thereof are formed, in order from the major surface side, (1) an amorphous Ni alloy layer 0.1-1 μm in film thickness, (2) an Ni layer 1-5 μm in film thickness, and (3) an Au layer 0.05-4 μm in film thickness, the ratio of the Ni alloy layer and the Ni layer (Ni alloy layer thickness/Ni layer thickness) being 0.3 or less.

9 Claims, 2 Drawing Sheets

(51) Int. Cl.
| | |
|---|---|
| *C25D 5/50* | (2006.01) |
| *C25D 7/00* | (2006.01) |
| *C23C 18/16* | (2006.01) |
| *B32B 15/01* | (2006.01) |
| *C22C 21/00* | (2006.01) |
| *C22C 45/04* | (2006.01) |
| *B22F 7/08* | (2006.01) |
| *C22C 26/00* | (2006.01) |
| *F28F 3/00* | (2006.01) |
| *B22D 18/02* | (2006.01) |

(52) U.S. Cl.
CPC .............. *C22C 21/00* (2013.01); *C22C 26/00* (2013.01); *C22C 45/04* (2013.01); *C23C 18/1653* (2013.01); *C25D 5/12* (2013.01); *C25D 5/50* (2013.01); *C25D 7/00* (2013.01); *F28F 3/00* (2013.01); *H01L 23/3732* (2013.01); *H01L 2924/0002* (2013.01)

(56) References Cited

FOREIGN PATENT DOCUMENTS

| JP | H09-51054 A | 2/1997 | | |
|---|---|---|---|---|
| JP | 09-157773 A | 6/1997 | | |
| JP | 2000-303126 A | 10/2000 | | |
| JP | 2003-168771 A | 6/2003 | | |
| JP | 2007-518875 A | 7/2007 | | |
| JP | 2007-2470578 A | 9/2007 | | |
| JP | 2008-258511 A | 10/2008 | | |
| JP | 2010-103377 A | 5/2010 | | |
| JP | 2012-158817 | * | 8/2012 | ............. C22C 26/00 |
| WO | 2005/035808 A2 | 4/2005 | | |
| WO | 2005/035808 A3 | 4/2005 | | |
| WO | 2010/007922 A1 | 1/2010 | | |

OTHER PUBLICATIONS

English translation of JPH 07-007243 provided by the JPO website, internet retrieval date of Mar. 20, 2016.*
International Search Report for PCT/JP2012/068130 dated Oct. 23, 2012.
Extended European Search Report for Application No. 12816956.2, dated Feb. 13, 2015.
Kevin Loutfy et al. "Advanced diamond based metal matrix composites for thermal management of RF devices," Wireless and Microwave Technology Conference, Apr. 18, 2011, pp. 1-5.
Office Action issued in corresponding Chinese Patent Application No. 201280037344.9 dated Feb. 1, 2016.

* cited by examiner

HEAT DISSIPATING COMPONENT FOR SEMICONDUCTOR ELEMENT

TECHNICAL FIELD

The present invention relates to a heat dissipating component for a semiconductor element.

BACKGROUND ART

In general, with semiconductor elements that are used for optical communications such as semiconductor laser elements and RF elements, the issue of how to efficiently dissipate heat generated from the elements is very important for preventing operation failures. In recent years, progress in the art of semiconductor elements has been accompanied by higher power, higher speed and higher integration of elements, placing stricter demands on the ability to dissipate heat. For this reason, high thermal conductivity is generally required in heat dissipating components such as heat sinks, so copper (Cu) which has a high thermal conductivity of 390 W/mK is used.

On the other hand, individual semiconductor elements have become larger in size with higher power, and the problem of mismatches between the thermal expansion of semiconductor elements and the heat sinks used for heat dissipation has become more apparent. In order to solve these problems, the development of a heat sink material having both the property of high thermal conductivity and a coefficient of thermal expansion matching that of semiconductor elements has been sought. As such materials, composites of metals and ceramics, such as composites of aluminum (Al) and silicon carbide (SiC), have been proposed (Patent Document 1).

However, no matter how the conditions are optimized in an Al—SiC composite, the thermal conductivity is 300 W/mK or less, so the development of a heat sink material having a thermal conductivity that is even higher than the thermal conductivity of copper has been sought. As such a material, a metal-diamond composite combining the high thermal conductivity of diamond and the high coefficient of thermal expansion of metals, having a high thermal conductivity and a coefficient of thermal expansion close to that of semiconductor element materials has been proposed (Patent Document 2).

Additionally, Patent Document 3 describes forming a β-type SiC layer on the surface of diamond particles to suppress the generation of metal carbides of low thermal conductivity formed during compositing and to improve the wettability with molten metals, thereby improving the thermal conductivity of metal-diamond composites.

Furthermore, since diamond is a very hard material, the metal-diamond composites obtained by compositing with metals are similarly very hard, and therefore difficult to work. For this reason, metal-diamond composites are almost unworkable with normal diamond tools, so in order to use metal-diamond composites as heat sinks which are compact and exist in various shapes, there is the issue of how to shape them at low cost. In response to this issue, laser machining and waterjet machining have been considered, and since metal-ceramic composites can pass electricity, methods of machining by electrical discharge have also been considered.

With heat dissipating components for use with semiconductor elements, a metal layer must be added to the surface of the heat dissipating component by coating or the like in order to enable them to be attached to the elements. In the case of normal semiconductor elements, bonding by solder is most common, with a bonding temperature of 300° C. or less, so a metal layer is provided on the surface by plating a Ni—P alloy or the like. However, regarding the manner of use of materials for heat sinks, heat sinks are usually arranged in contact with the semiconductor element by bonding with a brazing material in order to enable efficient dissipation of the heat generated by the semiconductor element. For this reason, multilayered plating having metal plating added to the bonding surface is used. Furthermore, with this manner of use, higher bonding temperatures and increases in the temperature load at the time of actual use can cause amorphous metals to crystallize in conventional alloy plating such as Ni—P alloys, and the change in volume can result in formation of microcracks, with the cracks being extended with subsequent temperature loads.

Furthermore, when a heat sink is bonded to a semiconductor element with brazing materials or the like, the planar precision of the bonding boundary is important for heat dissipation. In the case of conventional metal-diamond composites, diamond particles are exposed on the contact surface, making the contact surface rough, and consequently increasing the thermal resistance of the contact boundary which is undesirable. For this reason, there is also the issue of how to reduce the roughness of the surface as a property sought in heat sink materials.

Patent Document 1: JP H9-157773 A
Patent Document 2: JP 2000-303126 A
Patent Document 3: JP 2007-518875 A

SUMMARY OF THE INVENTION

The present invention was made in view of the above-described circumstances, and has the purpose of offering a heat dissipating component for a semiconductor element having both a high thermal conductivity and a coefficient of thermal expansion close to that of semiconductor elements, that has improved surface roughness flatness of the surface so as to be suitable for use as a heat sink for a semiconductor element, and does not crack at surface metal layer portions even upon actual use under high duress.

In other words, the present invention offers a heat dissipating component for a semiconductor element, comprising an aluminum-diamond composite formed by covering both main faces of a plate-shaped body of thickness 0.4 to 6 mm comprising 40 vol % to 70 vol % diamond particles, the balance consisting of a metal having aluminum as a main component, with a covering layer consisting of a metal having aluminum as a main component or an aluminum-ceramic composite material; wherein (1) an amorphous Ni alloy layer of film thickness 0.1 to 1 μm, (2) a Ni layer of film thickness 1 to 5 μm, and (3) an Au layer of film thickness 0.05 to 4 μm are formed, sequentially from a main face side, on both main faces of the aluminum-diamond composite, such that a ratio between the Ni alloy layer and the Ni layer (Ni alloy layer thickness/Ni layer thickness) is 0.3 or less.

In one embodiment, the covering layer is a metal layer of film thickness 0.03 to 0.2 mm comprising at least 80 vol % of a metal having aluminum as a main component and in another embodiment, the covering layer is a layer comprising, from a plate-shaped body side, an aluminum-ceramic composite layer of film thickness 0.05 to 0.2 mm, and a metal layer of film thickness 0.1 to 2 μm, having aluminum as a main component. Additionally, in yet another embodiment, the covering layer is aluminum-ceramic fiber composite layer of film thickness 0.05 to 0.2 mm comprising at least 80 vol % of a metal having aluminum as a main component.

In another embodiment, the Ni alloy layer, Ni layer and Au layer are formed by plating, the underlying Ni alloy layer is formed by electroless plating pre-treated by zinc substitution, and the peel strength of the plating film is at least 5 kg/cm, and in yet another embodiment, the semiconductor element is an RF element or semiconductor laser element consisting of GaN, GaAs or SiC.

Furthermore, in another embodiment of the present invention, the aluminum-diamond composite is produced by squeeze casting, and/or has a thermal conductivity at 25° C. of at least 400 WV/mK and a coefficient of thermal expansion from 25° C. to 150° C. of $5\times10^{-6}$ to $10\times10^{-6}$/K.

Additionally, in another embodiment of the present invention, the aluminum-diamond composite in the heat dissipating component of the present invention is an aluminum-diamond composite in which the diamond particles are characterized by the presence of a layer of β-type silicon carbide chemically bonded to a surface thereof.

In the heat dissipating component for a semiconductor element consisting of the above arrangement, the aluminum-diamond composite has a high thermal conductivity and a coefficient of thermal expansion close to that of the semiconductor element, and the surface metal layer is provided with a specific layer structure, so it is capable of suppressing the occurrence of cracks and the like in the surface metal layer portions even upon actual use under high duress.

MODES FOR CARRYING OUT THE INVENTION

Explanation of Terminology

The terminology and symbols used in the present specification and claims have the meaning that is normally understood by those skilled in the art. In particular, in the present specification, the word "to" refers to a range that is inclusive from "at least" to "at most". Therefore, for example, "A to B" refers to a range of at least A and at most B.

Additionally in the present specification, "both faces" and "both main faces" of a plate-shaped body refer to the two opposing faces of the plate-shaped body, while "side face portion" refers to the faces roughly perpendicular to both faces. Therefore, "both faces" and "both main faces" of an aluminum-diamond composite formed in the shape of a plate refer to the upper and lower faces of the composite, and "side face portion" refers to the portions roughly perpendicular to both faces.

Herebelow, an embodiment of the heat dissipating component for a semiconductor element according to the present invention will be explained with reference to the attached drawings.

Embodiment 1

Figure 1:
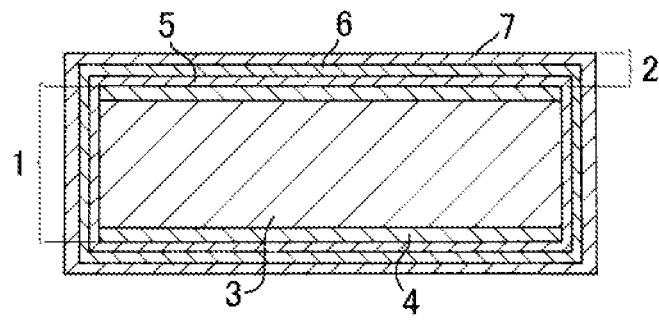
FIG. 1 A schematic section view showing the structure of a heat dissipating component for a semiconductor element according to Embodiment 1 of the present invention.

As shown in FIG. 1, the heat dissipating component for a semiconductor element according to Embodiment 1 of the present invention is composed of an aluminum-diamond composite 1 and a surface metal layer 2. The aluminum-diamond composite 1 consists of a plate-shaped composite portion 3 consisting of an aluminum-diamond composite material comprising diamond particles and a metal having aluminum as a main component, and a covering layer 4 provided on both faces of the composite portion 3. In the aluminum-diamond composite material, the diamond particle content is 40 vol % to 70 vol % of the aluminum-diamond composite material overall. The covering layer 4 consists of a material comprising a metal containing aluminum, and the surface metal layer 2 consists of an amorphous Ni alloy layer 5, Ni layer 6 and Au layer 7.

The heat dissipating component for a semiconductor element of this structure has high thermal conductivity and a coefficient of thermal expansion close to that of semiconductor elements, and further has the effect of suppressing the occurrence of cracks or the like on the surface metal layer portion even upon actual use under high duress.

Herebelow the structure of a heat dissipating component for a semiconductor element according to Embodiment 1 will be described together with its production method.

[Aluminum-Diamond Composite]

In general, methods for producing aluminum-diamond composites can be divided largely into two types, these being impregnation and powder metallurgy. Of these, those that are actually on the market are mostly formed by impregnation for their properties such as thermal conductivity. There are various methods of impregnation, including those performed at standard pressure, and high-pressure forging performed at high pressure. High-pressure forging includes squeeze casting and die casting. A suitable method for the present invention is high-pressure forging wherein impregnation is performed at a high pressure, and squeeze casting is preferred in order to obtain dense composites excelling in properties such as thermal conductivity. Squeeze casting generally refers to a method involving filling a high-pressure vessel with a powder such as diamond or a compact, and impregnating this with molten aluminum alloy or the like at high temperature and high pressure to obtain a composite material.

(Diamond Powder)

The diamond powder used as the raw material may be a natural diamond powder or an artificial diamond powder. Additionally, a binder such as silica may be added to the diamond powder as needed, and a compact can be formed by adding a binder.

Regarding the granularity of the diamond powder, a powder with an average grain size of at least 50 μm is preferable, and an average grain size of at least 100 μm is even more preferable for the purposes of achieving thermal conductivity. As for the upper limit of the grain size of the diamond particles, there is no limit governed by the properties as long as it is less than the thickness of the resulting composite, but it should preferably be 500 μm or less in order to obtain a composite at a stable cost. Additionally in order to raise the filling rate of the diamond particles, it is still more preferable to use a granularity blend comprising 60 vol % to 80 vol % of a diamond powder with an average grain size of at least 100 μm and 20 vol % to 40 vol % of a diamond powder with an average grain size of at most 30 μm.

Additionally the diamond particle content in the aluminum-diamond composite should preferably be at least 40 vol % and at most 70 vol %. If the diamond particle content is at least 40 vol %, then the resulting aluminum-diamond composite will have sufficient thermal conductivity. Additionally, for the purpose of the filling rate, the diamond particle content should preferably be 70 vol % or less. As long as it is 70 vol % or less, there is no need to shape the diamond particles to be spherical, and an aluminum-diamond composite can be obtained at a stable cost.

In a composite obtained by squeeze casting, under appropriate conditions, the melt will fill in the gaps between the powders, so the proportional volume of the powder with respect to the fill volume is roughly equal to the volume of the powder material (particle content) with respect to the volume of the resulting composite overall.

Furthermore, by using a diamond powder having a layer of β-type silicon carbide formed on the surface of the above-described diamond particles, the generation of metal carbides ($Al_4C_3$) having low thermal conductivity that are formed during compositing can be suppressed, and the wettability with molten aluminum can be improved. As a result, the thermal conductivity of the resulting aluminum-diamond composite is improved.

Figure 2:
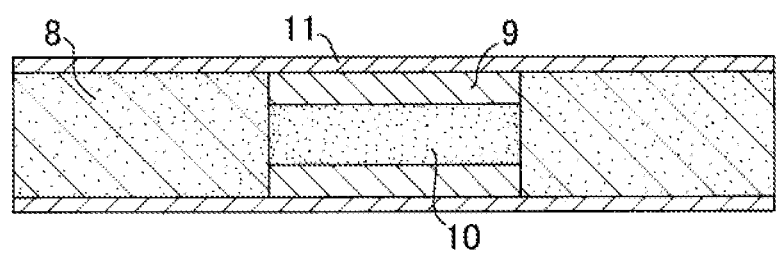
FIG. 2 A schematic section view for explaining one step in producing a composited portion of an aluminum-ceramic composite constituting the heat dissipating component for a semiconductor element of FIG. 1.

FIG. 2 shows the structure before being subjected to squeeze casting to form a composite. As can be seen from this drawing, as preparation for squeeze casting, a pair of dense mold release plates 9 coated with mold release agent are positioned vertically opposite each other, and the space in between is filled with diamond powder 10, after which mold members 8 consisting of porous materials capable of being impregnated with aluminum alloy are arranged in contact with the side surface portions so as to sandwich the mold release plates 9 filled with diamond powder 10 from the sides, and in some cases, metal plates 11 are further arranged in contact with the mold release plates 9 from above and below; to form a structure for squeeze casting. When this structure is filled with a melt of aluminum alloy or the like, the melt passes through the mold members 8 consisting of a porous material and reaches the portion filled with diamond powder 10 to form a composite of diamond powder 10 and aluminum alloy (Mold Member Consisting of Porous Material)

In this case, the material of the mold member 8 consisting of a porous material capable of being impregnated with aluminum alloy during squeeze casting is not particularly restricted as long as it is a porous material that can be impregnated with aluminum alloy by squeeze casting. However, the porous material is preferably a porous material of graphite, boron nitride, alumina fiber or the like, having excellent heat resistance and capable of stably supplying melt (Mold Release Plates)

Furthermore, the dense mold release plates 9 may be stainless steel plates or ceramic plates, and are not particularly limited as long as they are dense materials that are not penetrated by the aluminum alloy during squeeze casting. Additionally the mold release agent applied to the mold release plates is preferably a mold release agent excelling in heat resistance such as graphite, boron nitride or alumina. Furthermore, by applying the mold release agent after coating the surface of the mold release plates with an alumina sol or the like, it is possible to obtain mold release plates capable of achieving more stable mold release.

In the present embodiment, the mold release plates 9 provided on both surfaces are stripped after compositing, and these characteristic features enable an aluminum-diamond composite having a very smooth surface to be obtained.

While the metal plate 11 is optional, providing this enables the melt to be evenly impregnated, and allows operations following impregnation such as removal of the aluminum-diamond composite to be easily performed. Additionally as explained below, a metal plate 11 is provided when a plurality of structures are stacked to form a block.

(Aluminum Alloy)

The aluminum alloy (metal mainly composed of aluminum) in the aluminum-diamond composite according to the present embodiment should preferably have a low melting point in order to enable sufficient penetration into the cavities in the diamond powder (between diamond particles) during impregnation. An example of such an aluminum alloy is, for example, an aluminum alloy comprising 5-25 mass % of silicon. By using an aluminum alloy comprising 5-25 mass % of silicon, it is possible to obtain the effect of promoting the densification of the aluminum-diamond composite.

Furthermore, magnesium is preferably included in the above aluminum alloy, in order to make the bonding of the diamond particles and ceramic particles with the metal portions stronger. As for metal components in the aluminum alloy other than aluminum, silicon and magnesium, there are no particular restrictions as long as it is within a range wherein the properties of the aluminum alloy do not extremely change. For example, copper or the like may be included.

The thickness of the aluminum-diamond composite according to the present embodiment can be adjusted depending on the amount of diamond powder loaded at the time of compositing, and the thickness should preferably be 0.4 to 6 mm. When the thickness is less than 0.4 mm, there is insufficient strength for use as a heat sink or the like, which is not desirable. When the thickness exceeds 6 mm, the material itself becomes expensive, and the high thermal conductivity effects of the present invention cannot be adequately achieved, which is not desirable.

(Squeeze Casting Step)

Several of the resulting structures are stacked to form blocks, and these blocks are heated to about 600 to 750° C. Then, one or more of these blocks are arranged inside a high-pressure container, and in order to prevent temperature loss of the blocks, an aluminum alloy melt heated to at least the melting point is poured as quickly as possible and compressed at a pressure of at least 20 MPa.

In this case, as long as the heating temperature of the blocks is at least 600° C., the compositing of the aluminum alloy is stable, and an aluminum-diamond composite having sufficient thermal conductivity can be obtained. Additionally, as long as the heating temperature is 750 CC or less, the formation of aluminum carbides ($Al_4C_3$) on the diamond powder surface during compositing with the aluminum alloy can be suppressed, resulting in an aluminum-diamond composite having sufficient thermal conductivity.

Additionally the compositing of the aluminum alloy will be stable as long as the pressure at the time of impregnation is at least 20 MPa, resulting in an aluminum-diamond composite having sufficient thermal conductivity. More preferably the impregnation pressure is at least 50 MPa. As long as the pressure is 50 Pa or more, an aluminum-diamond composite having more stable thermal conductivity properties can be obtained.

(Annealing Process)

The aluminum-diamond molded article obtained by the above operations may be subjected to an annealing process. By performing an annealing process, strain can be eliminated from the inside of the above aluminum-diamond molded article, resulting in an aluminum-diamond composite having more stable thermal conductivity properties.

In order to eliminate the strain in the molded article without affecting the surface of the resulting aluminum-diamond molded article, the anneal should preferably be performed at a temperature of 400° C. to 550° C. for at least 10 minutes.

(Machining Method)

Next, examples of machining methods for the aluminum-diamond composite according to the present embodiment will be explained. The above aluminum-diamond composite is an extremely hard material that is difficult to machine. For this reason, while machining with normal diamond machine tools is possible, waterjet machining, laser machining and electrical discharge machining are preferred for durability of the machine tools and machining cost (Covering Layer)

As shown in FIG. 1, in the aluminum-diamond composite 1 of the heat-dissipating component for a semiconductor element according to the present embodiment, both surfaces of the composited portion 3 are coated with a covering layer 4 consisting of a material comprising a metal having aluminum as a main component (aluminum alloy).

The method of formation of the covering layer 4 may be any method. For example, during the squeeze casting process, by providing an aluminum foil or aluminum alloy foil on the mold release plate 9 side when loading diamond powder between the mold release plates 9 and performing squeeze casting using the aluminum alloy in this state, the aluminum foil or the like will melt to form a covering layer of aluminum alloy on the surface of the composite. In another method, for example, the diamond powder 10 may be pre-formed into a molded article, and when loading it between the mold release plates 9, it may be arranged so that an appropriate gap is formed between the mold release plates 9 and the molded article of diamond powder 10, so that the melt will enter into the gap during squeeze casting to form a covering layer 4 consisting of the melt components. Additionally, these methods may be combined.

While the covering layer 4 will mainly consist of a material comprising a metal having aluminum as the main component, substances other than metals having aluminum as the main component may also be included. In other words, the above-mentioned diamond particles or other impurities may also be included.

However, diamond particles preferably should not be present at portions 0.01 mm from the surface of the covering layer 4. Due to this arrangement, machining methods that are normally employed in metalworking can be used, resulting in a smooth covering layer without polishing scars.

Additionally, the above covering layer preferably comprises at least 80 vol % of a metal having aluminum as a main component. As long as the amount of the metal having aluminum as the main component is at least 80 vol %, methods that are normally employed in metalworking can be used, and the covering layer 4 can be polished. Furthermore, it is more preferable for the amount of the metal having aluminum as the main component to be at least 90 vol %. If the amount of the metal having aluminum as the main component is at least 90 vol %, impurities or the like on the inside will not come free and form polishing scars when the surface is being polished.

Additionally, the thickness of the covering layer 4 should preferably be at least 0.03 mm and at most 0.2 mm by average thickness. If the average thickness of the covering layer 4 is at least 0.03 mm, the diamond particles will not be exposed by subsequent working, enabling the desired planar precision and plating properties to be easily obtained. Additionally, if the average thickness of the covering layer 4 is 02 mm or less, then sufficient thickness can be obtained for the composited portion 3 occupying the resulting aluminum-diamond composite, enabling sufficient thermal conductivity to be achieved.

Additionally, the sum of average thicknesses of the covering layers 4 on both surfaces should preferably be 20% or less, more preferably 10% or less, of the thickness of the aluminum-diamond composite 1. If the sum of the average thicknesses of the covering layers 3 on the surfaces of both faces is 20% or less of the thickness of the aluminum-diamond composite 1, then sufficient thermal conductivity can be obtained in addition to planar precision and plating properties.

(Machining of Covering Layer)

The aluminum-diamond composite according to the present embodiment has a structure wherein both faces are coated with a covering layer 4 consisting of a material comprising a metal having aluminum as a main component. The surface precision (surface roughness Ra) can be adjusted by working (polishing) this covering layer 4. The working of this covering layer 4 may be performed using processing methods that are normally employed in metalworking, for example, by grinding with a buff grinder, to a surface roughness (Ra) of 1 µm or less.

Furthermore, the average thickness of the surface layer can be adjusted by working this covering layer 4. If the aluminum-diamond composite according to the present embodiment is to be used as a heat dissipating component such as a heat sink, when considering the thermal resistance at the bonding interface, the surface should preferably be smooth with a low surface roughness, the surface roughness (Ra) being preferably 1 µm or less, and more preferably 0.5 fun or less. By setting the surface roughness to 1 µm or less, the thickness of the bonding layer can be made uniform, enabling a higher heat dissipating ability to be obtained.

Additionally, the flatness of the covering layer, when converted for a size of 50 mm×50 mm, should preferably be 30 µm or less, and more preferably 10 µm or less. By having a flatness of 30 µm or less, the thickness of the bonding layer can be made uniform, enabling a higher heat dissipating ability to be obtained.

[Surface Metal Layer]

The heat dissipating component for a semiconductor element according to the present embodiment, when used as a heat sink for the semiconductor element, will often be used by being attached to the semiconductor element by brazing. Therefore, as shown in FIG. 1, a surface metal layer 2 will be provided on the bonding surface. The method of formation of the surface metal layer 2 may be a method such as plating, vapor deposition, sputtering or the like. When considering the processing costs, plating is preferred, so plating will be explained below.

The method of plating is not particularly limited, and either electroless plating or electroplating may be used. In the case of plating onto aluminum, it is preferable to perform underplating with a Ni alloy plate which has excellent adhesion with aluminum. In this case, the Ni alloy plating is generally an alloy plating comprising Ni and 5-15 wt % of phosphorus (P), performed by electroless plating. The resulting Ni alloy plating is amorphous with a film thickness of 0.1 to 2 µm. If the thickness of the Ni alloy plating is less than 0.1 µm, there may be pinholes (unplated portions) in the plating film, which is undesirable. If 2 µm is exceeded, in applications such as the present invention, higher bonding temperatures and increases in the temperature load during actual use can result in problems such as crystallization of amorphous Ni alloy plating, in which case the changes in volume may cause microcracks and subsequent temperature loads can cause the cracks to expand.

Furthermore, when plating aluminum with an Ni alloy pretreatments such as zinc substitution are necessary, and it is preferable to perform zinc substitution for excellent plating adhesion. Regarding the adhesion of Ni alloy plating, the peel strength should preferably be at least 5 kgf/cm, and more preferably at least 8 kgf/cm. If the peel strength is less than 5 kgf/cm, when used as a heat dissipating component for a semiconductor element, the temperature load during actual use can result in problems such as separation of the plating layer, which is undesirable.

Next, the surface of the Ni alloy plating is plated with crystalline Ni with a film thickness of 1 to 5 µm. While the plating method is preferably an electroplating method, a electroless plating method may also be used it a crystalline Ni plating film can be obtained. If the thickness of the Ni plating is less than 1 µm, pinholes (unplated portions) may occur in the plating film, which is undesirable. At more than 5 µm, the residual stresses occurring in the plating film will increase, and for applications such as the present invention, the temperature load during actual use can cause problems such as separation of the plating film or occurrence of cracks, which is undesirable.

Furthermore, in applications for use as heat dissipating components of high-power semiconductor elements as in the present invention, higher bonding temperatures and increased temperature load during actual use can result in problems such as crystallization of the amorphous Ni alloy plating, in which case the change in volume can result in microcracks, and the subsequent temperature load can expand the cracks. Additionally, there will be residual compression stress on the Ni alloy plating layer and residual tensile stress on the Ni plating layer, so the reliability can be improved by correcting the Ni alloy plating thickness and Ni plating thickness. Specifically the ratio between the Ni alloy layer and the Ni layer (Ni alloy layer thickness/Ni layer thickness) should preferably be 0.3 or less, and more preferably 0.2 or less. If the ratio between the Ni alloy layer and the Ni layer exceeds 0.3, then in the present application, higher bonding temperatures and increased temperature load during actual use can result in problems such as cracks forming in the surface metal layer.

Additionally since the present invention involves high-temperature brazing, the outermost surface is plated with Au by electroplating or electroless plating to a film thickness of 0.05 to 4 µm. If the plating film thickness is less than 0.05 µm, the bonding will be insufficient. As for the upper limit, there are no restrictions in terms of the properties, but Au plating is extremely expensive, so it should preferably be 4 µm or less.

Additionally, the aluminum-diamond composite according to the present embodiment should preferably have a thermal conductivity of at least 400 W/mK when the temperature of the aluminum-diamond composite is 25° C., and a coefficient of thermal expansion of 5 to $10 \times 10^{-6}$/K from 25° C. to 150° C.

If the thermal conductivity at 25° C. is at least 400 W/mK and the coefficient of thermal expansion from 25° C. to 150° C. is 5 to $10 \times 10^{+6}$/K, then a high thermal conductivity and a low rate of thermal expansion of the same level as the semiconductor element can be obtained. Therefore, when used as a heat dissipating component such as a heat sink, it will have excellent heat dissipating properties, and even if the temperature changes, the difference in coefficient of thermal expansion between the semiconductor element and the heat dissipating component is small so destruction of the semiconductor element can be avoided. As a result, it can be advantageously used as a highly reliable heat dissipating component.

[Heat Dissipating Component for Semiconductor Element]

The heat dissipating component for a semiconductor element using the aluminum-diamond composite of the present invention has a high thermal conductivity and a low coefficient of thermal expansion of the same level as the semiconductor element, so it is suitable for use as a heat dissipating component in an RF element or a semiconductor laser element of GaN, GaAs, SiC or the like requiring high power output. In particular, it is suitable for use as a heat dissipating component for GaN-HEMT devices or GaAs-HEMT devices which are RF elements.

Embodiment 2

Figure 3:
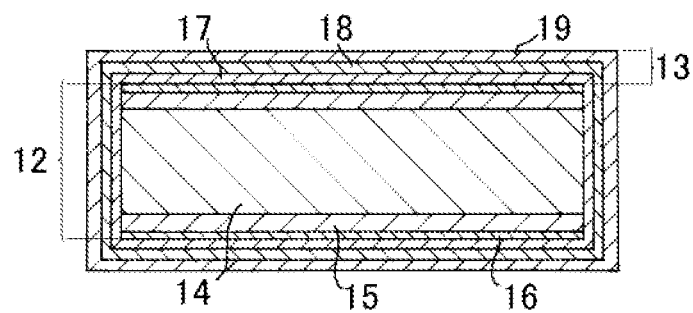
FIG. 3 A schematic section view showing the structure of a heat dissipating component for a semiconductor element according to Embodiment 2 of the present invention.

The heat dissipating component for a semiconductor element according to Embodiment 2 of the present invention is composed of an aluminum-diamond composite 12 and a surface metal layer 13, as shown in FIG. 3. The aluminum-diamond composite 12 consists of a plate-shaped composited portion 14 consisting of an aluminum-diamond composite material comprising diamond particles and a metal mainly composed of aluminum, and two covering layers 15, 16 provided on both sides of the composited portion 14. In the aluminum-diamond composite material, the diamond particle content is 40 vol % to 70 vol % of the entire aluminum-diamond composite material. As for the covering layers 15, 16, the covering layer 15 on the composited portion 14 side consists of an aluminum-ceramic composite, while on the other side, the covering layer 16 consists of a metal layer mainly composed of aluminum. The surface metal layer 13 consists of an amorphous Ni alloy layer 17, a Ni layer 18 and an Au layer 19.

The heat dissipating component for a semiconductor element of this structure also has high thermal conductivity and a coefficient of thermal expansion close to that of the semiconductor element, and furthermore, provides the effect of being able to suppress the occurrence of cracks or the like at the surface metal layer portion even upon actual use under high duress.

The heat dissipating component for a semiconductor element according to Embodiment 2 differs from the structure in Embodiment 1 in that the covering layer of the aluminum-diamond composite 12 is composed of a covering layer 15 consisting of an aluminum-ceramic composite on the composited portion 14 side and a covering layer 16 consisting of a metal layer mainly composed of aluminum on the other side. Herebelow, the embodiment will be explained in detail together with the method of production, focusing on the portions that are different in structure, but those portions that are not explained are the same as Embodiment 1.

[Aluminum-Diamond Composite]

Figure 4:
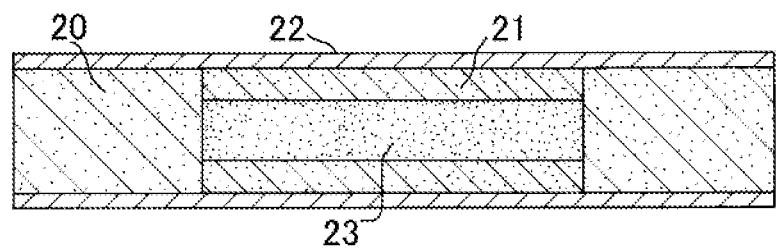
FIG. 4 A schematic section view for explaining one step in producing a composited portion of an aluminum-ceramic composite constituting the heat dissipating component for a semiconductor element of FIG. 3.

In the present embodiment, a portion comprising a plate-shaped composited portion 14 consisting of an aluminum-diamond composite material and a covering layer 15 consisting of an aluminum-ceramic composite coated onto the composited portion 14 is first produced. In other words, as shown in FIG. 4, a mold member 10 consisting of a porous material capable of being impregnated with an aluminum alloy, a ceramic porous body 21, a dense mold release plate 22 coated with a mold release agent and a diamond powder 23 are arranged to form a structure for squeeze casting, and after compositing an aluminum alloy by squeeze casting, the aluminum-ceramic composite present on the outer surface portions of the aluminum-diamond composite after compositing are ground to produce a structure wherein both surfaces of a composited portion 14 are coated with a covering layer 15 consisting of an aluminum-ceramic composite of thickness 0.05 to 0.2 mm. Next this structure is machined by a waterjet cutter or a laser cutter, after which a covering layer 16 of thickness 0.05 to 2.0 μm is formed on the surface thereof.

(Ceramic Porous Body)

The ceramic porous body 21 is a porous body of a porous material capable of being impregnated by an aluminum alloy by squeeze casting, comprising at least one of silicon carbide, silicon nitride and aluminum nitride, among which silicon carbide is preferable for the thermal conductivity of the resulting aluminum-ceramic composite. The porosity of the ceramic porous body should be such that there are sufficient pores to enable impregnation of aluminum alloy by squeeze casting, which is 20 to 60 vol %. On the other hand, the ceramic content in the aluminum-ceramic composite should preferably be adjusted to make the difference in coefficient of thermal expansion between the aluminum-diamond composite and the aluminum-ceramic composite as small as possible. When the difference in coefficient of thermal expansion between the aluminum-diamond composite and the aluminum-ceramic composite is large, warping may occur during subsequent processing steps, which is not desirable.

(Machining Method)

As described above, after compositing, an aluminum-ceramic composite present on the outer surface portion of the aluminum-diamond composite is ground to produce a structure wherein both surfaces of a composited portion 14 are coated with a covering layer 15 consisting of an aluminum-ceramic composite of thickness 0.05 to 0.2 mm. The grinding is performed using diamond machine tools and diamond abrasive grains. Furthermore, when working the aluminum-diamond composite itself such as when making hole portions, for example, a waterjet cutter, laser cutter or electrical discharge cutter should be used.

(Covering Layer)

In the aluminum-diamond composite according to the present embodiment, both surfaces of the composited portion 14 are coated with a covering layer 15 consisting of an aluminum-ceramic composite of thickness 0.05 to 0.2 mm and as mentioned above, this covering layer 15 is formed together with the composited portion 14 by squeeze casting, but as a different method, it is possible to prepare only the aluminum-ceramic composite beforehand, then join the aluminum-diamond composite to the composited portion 14 during the production process, to produce the aluminum-diamond composite 12 of FIG. 3.

Additionally, the thickness of the above-mentioned covering layer 15 consisting of an aluminum-ceramic composite should preferably be at least 0.05 mm and at most 0.2 mm. If the thickness of the covering layer 15 is at least 0.05 mm, then it is easy to obtain the desired planar precision (surface roughness). Additionally, if the average thickness of the covering layer 15 is at most 0.2 mm, then although also dependent on the thickness of the resulting aluminum-diamond composite 12, it is possible to obtain sufficient thickness for the composited portion 14 occupying the composite 12 and to ensure sufficient thermal conductivity The aluminum-diamond composite 12 according to the present embodiment has a structure wherein both surfaces are coated with a covering layer 15 consisting of an aluminum-ceramic composite, so the surface precision (surface roughness Ra) and flatness can be adjusted by machining (polishing) the covering layer 15. This machining can be performed by employing methods using diamond abrasive grains or diamond grindstones, for example, by grinding with a grinding plate or the like, then polishing with a buff polisher to a surface roughness (Ra) of 1 μm or less. Furthermore, the average thickness of the surface layer can also be adjusted by working this covering layer 15.

Furthermore, in the present Embodiment 2 the plating adhesion is improved by cleaning the surface of the aluminum-diamond composite 12 on which the covering layer 15 is formed, and forming a further covering layer 16 consisting of a metal mainly composed of aluminum with a thickness of 0.05 to 2.0 μm on the surface. If the thickness of this covering layer 16 is less than 0.05 μm, then there may be portions not covered by the covering layer, or the covering layer may react during the plating pretreatment, forming pinholes which can result in unplated portions, thereby reducing the chemical resistance. On the other hand, if the covering layer thickness exceeds 2.0 μm, the difference in coefficient of linear thermal expansion between the covering layer 16 and the composite can result in differences in thermal expansion of the materials which may lead to generation of stress or separation. The thickness of the covering layer 16 should more preferably be 0.3 to 0.6 μm.

The covering layer 16 is formed by vapor deposition or sputtering to a thickness of 0.05 to 2.0 μm. The aluminum alloy constituting the covering layer 16 is either pure aluminum or an aluminum alloy comprising at least 70 mass % aluminum. If the aluminum content is less than 70 mass %, then it is not possible to provide Ni plating with sufficient adhesion by a zincate treatment. There are no particular limitations on the metal components in the aluminum alloy aside from aluminum and silicon as long as it is within a range wherein the properties do not greatly change. For example, magnesium, copper or the like may be included.

Additionally, in the present invention, the adhesion between the covering layer 16 of aluminum alloy or the like and the covering layer 15 consisting of an aluminum-ceramic composite on the surface of the aluminum-diamond composite 12 should preferably be improved by subjecting to a heat treatment for at least 1 minute at a temperature of 460 to 650° C. in an atmosphere of nitrogen, argon, hydrogen, helium or a vacuum. If the treatment is performed in an oxidative atmosphere, an oxide film can be formed on the surface, which can lead to subsequent plating defects. The temperature is preferably 480 to 570° C. If the temperature is 460° C. or less, then the adhesion between the covering layer 15 and the covering layer 16 becomes poor, and if the temperature is 650° C. or more, then the metal covering layer 16 can melt and cause the surface roughness to deteriorate.

Embodiment 3

Figure 5:
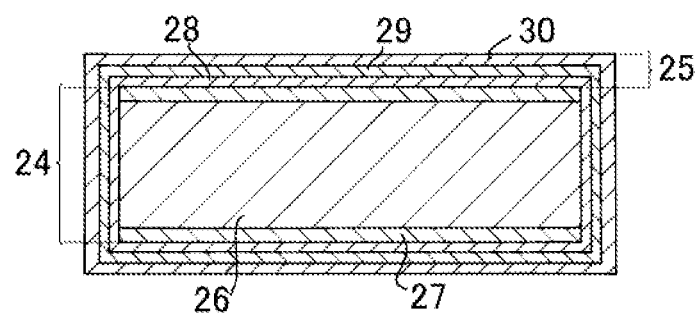
FIG. 5 A schematic section view showing the structure of a heat dissipating component for a semiconductor element according to Embodiment 3 of the present invention.

Next, the heat dissipating component for a semiconductor element according to Embodiment 3 shall be explained. As shown in FIG. 5, the heat dissipating component according to Embodiment 3 is composed of an aluminum-diamond composite 24 and a surface metal layer 25. The aluminum-diamond composite 24 consists of a plate-shaped composited portion 26 consisting of an aluminum-diamond composite material and covering layers 27 provided on both surfaces of the composited portion 26. The covering layer 27 consists of an aluminum-ceramic fiber composite material, and the surface metal layer 25 consists of an amorphous Ni alloy layer 28, a Ni layer 29 and an Au layer 30.

Figure 6:
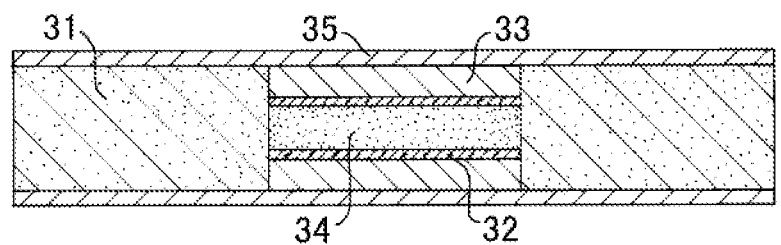
FIG. 6 A schematic section view for explaining one step in producing a composited portion of an aluminum-ceramic composite constituting the heat dissipating component for a semiconductor element of FIG. 5.

The heat dissipating component according to the present Embodiment 3, as shown in FIG. 6, involves compositing the aluminum alloy by squeeze casting with ceramic fibers 32 arranged between the dense mold release plates 33 to which a mold release agent has been applied and the diamond powder 34 loaded between the mold release plates 33, to obtain an aluminum-diamond composite 24 on which a covering layer 27 consisting of an aluminum-ceramic fiber composite has been formed on both surfaces of a composited portion 26.

[Covering Layer Consisting of Aluminum-Ceramic Fiber Composite]

The above-mentioned covering layer 27 consisting of an aluminum-ceramic fiber composite should have a content of less than 20 vol % of components other than aluminum alloy in accordance with the relationship between platability and surface precision. If the content of components other than aluminum alloy is less than 20 vol %, the covering layer 27 can be easily processed.

Additionally, while the ceramic fiber is not particularly limited, ceramic fibers such as alumina fibers, silica fibers, mullite fibers and graphite fibers are preferably used for their heat resistance. Additionally, the ceramic fiber content (Vt) should preferably be 10 vol % or less in view of the properties of the aluminum-ceramic fiber composite, and Vf should preferably be less than 20 vol % when stacked and compressed.

Additionally, the thickness of the ceramic fibers should preferably be 0.5 mm or less. If 0.5 mm or less, then the thickness of the surface layer can be appropriately set, and an aluminum-diamond composite having sufficient thermal conductivity can be obtained.

Aside from the fact that a layer consisting of an aluminum-ceramic fiber composite is used as the covering layer instead of the metal layer, Embodiment 3 is the same as Embodiment 1.

<Functions and Effects>

Herebelow the functions and effects of the heat dissipating component for a semiconductor element according to the above embodiment will be explained.

The heat dissipating component for a semiconductor element according to the above embodiment has covering layers (4; 15, 16; 27) formed on both faces of a plate-shaped composited portion (3; 14; 26) consisting of an aluminum-diamond composite material to form an aluminum-diamond composite (1; 12; 24), with surface metal layers (2; 13, 25) provided on both main faces of the aluminum-diamond composite (1; 12; 24) by forming an amorphous Ni alloy layer (5; 17; 28), Ni layer (6; 18; 29) and Au layer (7; 19; 30) in order from the main faces. Here, the covering layers consist of a metal layer mainly composed of aluminum (covering layer 4; Embodiment 1), an aluminum-ceramic composite layer (covering layer 15) and a metal layer (covering layer 16) (Embodiment 2), or an aluminum-ceramic fiber composite layer (covering layer 27; Embodiment 3).

In the heat dissipating component for a semiconductor element consisting of the above structure, the aluminum-diamond composite has a high thermal conductivity and a coefficient of thermal expansion close to that of the semiconductor element. Furthermore, the surface metal layer improves the platability of the surface, and the surface has low surface roughness and flatness, making it appropriate for use as a heat dissipating component such as a heat sink for dissipating heat from semiconductor elements.

Furthermore, if the thickness of the covering layer 4 is 0.03 to 0.2 mm, the thickness of the covering layer 15 is 0.05 to 02 mm and the thickness of the covering layer 27 is 0.05 to 0.2 mm, then it is easy to obtain the desired surface precision, and to ensure sufficient thermal conductivity.

Additionally, if the surface roughness (Ra) of the covering layer (4; 16; 27) is 1 μm or less, the thickness of the bonding layer can be made uniform, enabling a higher heat dissipating ability to be obtained.

Additionally, if the thickness of the above plate-shaped aluminum-diamond composite (1; 12; 24) is 0.4 to 6 mm, it has sufficient strength and heat dissipating properties for use as a heat dissipating component such as a heat sink.

Additionally, the aluminum-diamond composite may have a thermal conductivity of at least 400 W/mK when the temperature is 25° C., and the aluminum-diamond composite may have a coefficient of thermal expansion of 5 to $10 \times 10^{-6}$/K from 25° C. to 150° C. As a result, when used as a heat dissipating component such as a heat sink, it will excel in heat dissipating properties, and destruction of the semiconductor element can be avoided even it subjected to temperature changes, because the difference in coefficient of thermal expansion between the semiconductor element and the heat dissipating component is small.

Additionally, at least both main faces of the aluminum-diamond composite (1; 12; 24) are provided with a surface metal layer (2; 13; 25) obtained by forming an amorphous Ni alloy layer (5; 17; 28), Ni layer (6; 18; 29) and Au layer (7; 19; 30) in order from the main faces, and the ratio between the Ni alloy layer and the Ni layer (Ni alloy layer thickness/Ni layer thickness) is set to be 0.3 or less, enabling bonding by brazing or the like. In this way, when used as a heat dissipating component or the like to be bonded with a high-power semiconductor element, it is possible to achieve high reliability enabling cracking or the like of the surface metal layer portions to be suppressed even during actual use with a heavy load.

Additionally, by producing the above-described aluminum-diamond composite (1; 12; 24) by squeeze casting, a dense composite excelling in properties such as thermal conductivity can be obtained.

The heat dissipating component for a semiconductor element having the above structure, when used as a heat dissipating component or the like by bonding to a high-power semiconductor element has high heat dissipating properties, and is capable of achieving high reliability enabling cracking or the like of the surface layer metal portions to be suppressed even during actual use with a heavy load, so it is suitable for use as a heat dissipating component for RF elements or semiconductor lasers of GaN, GaAs, SiC or the like.

The heat dissipating component for a semiconductor element according to the present invention and its production method have been explained above with reference to embodiments, and they will be explained in further detail by giving examples below, but the present invention should not be construed as being limited to these embodiments and examples.

EXAMPLES

Examples 1-4

Commercially available high-purity diamond powder A (average grain size 180 μm), high-purity diamond powder B (average grain size 20 μm), high-purity diamond powder C (average grain size 2 μm) and aluminum powder (average grain size 30 μm) were mixed at the blending ratios shown in Table 1.

TABLE 1

| Type | Diamond Powder A (mass %) | Diamond Powder B (mass %) | Diamond Powder C (mass %) | Aluminum Powder (mass %) | Vf (vol %) |
|---|---|---|---|---|---|
| Example 1 | 70 | 30 | 0 | 0 | 62 |
| Example 2 | 100 | 0 | 0 | 0 | 55 |
| Example 3 | 75 | 0 | 0 | 25 | 40 |
| Example 4 | 60 | 30 | 10 | 0 | 70 |

Note 1:
Vf (diamond particle content) computed by: (diamond powder volume)/(fill volume: 40 × 40 × 2 mm = 3.2 cm$^3$)

Next, a 40×40×2 mmt stainless steel plate (SUS430 material) was coated with an alumina sol and baked for 30 minutes at 350° C., then a graphite mold release agent was applied to the surface to produce a mold release plate (mold release plate 9 of FIG. 2). Then, the diamond powders of Table 1 were loaded into an isotropic graphite jig (mold member 8 of FIG. 2) of 20% porosity having a 60×60×8 mmt outer shape and a 40×40×8 mmt hole in a central portion, with pure aluminum foil of thickness 30 μm disposed above and below, and both faces were sandwiched by mold release plate 9 to form a structure.

A plurality of the above structures were stacked with 60×60×1 mmt stainless steel plates coated with graphite mold release agent (metal plate 11 of FIG. 2) in between, iron plates of thickness 12 mm were placed on both sides, and these were attached with six M10 bolts and tightened with a torque wrench to a planar damping torque of 10 Nm to form a single block.

Next, the resulting block was preheated in an electrical furnace to a temperature of 650° C., then placed in a preheated press mold of inner diameter 300 mm, into which an aluminum alloy melt at temperature 800° C. comprising 12 mass % silicon and 1 mass % magnesium was poured, and compressed for 20 minutes at a pressure of 100 MPa to impregnate the diamond powder with the aluminum alloy. After cooling to room temperature, the block was cut along the shape of the mold release plates using a wet-type bandsaw, and the sandwiched stainless steel plates were stripped. Then, an anneal was performed for 3 hours at 530° C. to remove the strain of impregnation to obtain an aluminum-diamond composite.

The resulting aluminum-diamond composite was polished on both surfaces using #600 polishing paper, then buffed.

Next, a waterjet cutter (Sugino Machine Abrasive Jet Cutter NC) was used with garnet of grain size 100 μm as the polishing abrasive grains at conditions of pressure 250 MPa and processing speed 50 mm/min to work the block to a shape of 25×25×2 mmt to obtain an aluminum-diamond composite.

A cross section of the resulting aluminum-diamond composite was observed by factory microscope to measure the average thickness of the covering layer on both surfaces (covering layer 4 of FIG. 1). Additionally, the surface roughness (Ra) was measured with a surface roughness meter and the flatness was measured by three-dimensional profile measurement. The results are shown in Table 2.

Additionally, a sample for measurement of coefficient of thermal expansion (3×2×10 mm) and a sample for measurement of thermal conductivity (25×25×2 mmt) were produced by waterjet machining. The respective sample pieces were used to measure the coefficient of thermal expansion from temperatures of 25° C. to 150° C. using a thermal expansion meter (Seiko Electronics TMA300) and the thermal conductivity at 25° C. by laser flash analysis (Rigaku LF/TCM-8510B). The results are shown in Table 2.

Additionally, the density of the aluminum-diamond composite of Example 1 was found by Archimedes' principle to be 3.21 g/cm$^3$. Furthermore, bending strength test samples (3×2×40 mm) were produced for Example 1, and the 3-point bending strength as measured by a bending strength tester was found to be 320 MPa.

TABLE 2

| Type | Average Thickness of Covering Layer (mm) | Surface Roughness Ra (μm) | Flatness (μm) | Thermal Conductivity (W/mK) | Coefficient of Thermal Expansion (×10$^{-6}$/K) |
|---|---|---|---|---|---|
| Example 1 | 0.05 | 0.20 | 8 | 570 | 7.0 |
| Example 2 | 0.05 | 0.25 | 5 | 530 | 8.0 |
| Example 3 | 0.05 | 0.23 | 12 | 450 | 9.0 |
| Example 4 | 0.05 | 0.19 | 6 | 600 | 5.5 |

Additionally, after ultrasonically cleaning the above-mentioned aluminum-diamond composite, and after preprocessing with a Zn catalyst, electroless Ni—P, electro Ni and electro Au plating were performed to form plating layers (metal surface layers 2 of FIG. 1) of thickness 5 μm (Ni—P: 0.3 μm+Ni: 2.7 μm+Au: 2.0 μm) on the surfaces of the aluminum-diamond composites of Examples 1-4. Upon measuring the solder wet spreading rate on the resulting plated product according to JIS Z3197, all of the plated products had a solder wet spreading rate of at least 80%. Additionally, upon measuring the peel strength of the resulting plated products, it was found to be at least 10 kgf/cm for all of the plated products. Furthermore, after heating the resulting plated products for 10 minutes at a temperature of 400° C. at atmospheric pressure, then subjecting them to a 1000-cycle heat cycle test of holding for 30 minutes at a temperature of −55° C. at atmospheric pressure and holding for 30 minutes at a temperature of 175° C., no abnormalities such as peeling of the plating film and cracking were observed in any of the plated products.

As shown in Table 2, the aluminum-diamond composites of Examples 1-4 were extremely smooth with a surface roughness of 0.19 to 0.25 μm, and had high thermal conductivity and a coefficient of thermal expansion close to semiconductor elements.

Example 5

After mixing 35 g of a diamond powder A (average particle size 190 μm), 15 g of a diamond powder B (average particle size 20 μm), 16 g of a silica powder (average particle size 5 μm) and 16 g of a silicon powder (average particle size 10 μm), the mixture was loaded into a silicon carbide crucible and heat-treated for 3 hours at a temperature of 1450° C. in an argon atmosphere to produce a diamond powder having a layer of β-type silicon carbide formed on the diamond powder surface.

An aluminum-diamond composite was produced in the same manner as Example 1, except that a diamond powder having a layer of i-type silicon carbide formed on the surface was used as the diamond powder.

The resulting aluminum-diamond composites were subjected to the same polishing and machining as Example 1 and worked to a shape of 25×25×2 mmt to form aluminum-diamond composites, and cross sections of the aluminum-diamond composites were observed with a factory microscope to measure the average thickness of the covering layer (covering layer 4 in FIG. 1) on both surfaces, as a result of which the average thickness of the covering layer was found to be 0.05 mm. Additionally, the surface roughness (Ra) as measured with a surface roughness meter was 0.21 μm, and the flatness as measured by a three-dimensional shape measuring device was 7 μm.

Furthermore, the aluminum-diamond molded article of Example 5 was subjected to the same property evaluations as Example 1, upon which the density was found to be 3.20 g/cm$^3$, the coefficient of thermal expansion from temperatures of 25° C. to 150° C. was 7.2×10$^{-6}$/K, the thermal conductivity at a temperature of 25° C. was 650 W/mK and the three-point bending strength was 340 MPa.

Additionally, a plating layer (metal surface layer 2 of FIG. 1) of thickness 5 μm (Ni—P: 03 μm+Ni: 2.7 μm+Au: 2.0 μm) was formed on the surfaces of the aluminum-diamond composite as with Example 1. Upon measuring the peel strength of the resulting plated product, it was found to be 12 kgf/cm. Furthermore, after heating the resulting plated products for 10 minutes at a temperature of 400° C. at atmospheric pressure, then subjecting them to a 1000-cycle heat cycle test of holding for 30 minutes at a temperature of −55° C. at atmospheric pressure and holding for 30 minutes at a temperature of 175° C., no abnormalities such as peeling of the plating film and cracking were observed in any of the plated products.

In Example 5, a diamond powder having a layer of β-type silicon carbide formed on the surface was used. As a result, a high thermal conductivity of 650 W/mK and a coefficient of thermal expansion close to that of a semiconductor element were obtained.

Examples 6-91

Aluminum-diamond composites were prepared in the same way as in Example 1 except that the loaded amount of diamond powder was changed from that of Example 1, to form structures with a plate thickness of 0.4 mm in Example 6 and 6.0 mm in Example 7, and with a pure aluminum foil with a thickness of 15 μm in Example 8 and a thickness of 200 μm in Example 9 above and below the diamond powder at the time of stacking.

The resulting aluminum-diamond composites were subjected to the same polishing and machining as Example 1 and worked to a shape of 25×25×2 mmt to form aluminum-diamond composites, cross sections of the aluminum-diamond composites were observed with a factory microscope to measure the average thickness of the covering layer (covering layer 4 in FIG. 1) on both surfaces, the surface roughness (Ra) was measured with a surface roughness meter, and the flatness was measured by a three-dimensional shape measuring device, the results being shown in Table 3.

Additionally, the resulting aluminum-diamond composites were subjected to the same property evaluations as Example 1, and the results are shown in Table 3.

TABLE 3

| Type | Average Thickness of Covering Layer (mm) | Surface Roughness Ra (μm) | Flatness (μm) | Thermal Conductivity (W/mK) | Coefficient of Thermal Expansion (×10$^{-6}$/K) |
|---|---|---|---|---|---|
| Example 6 | 0.05 | 0.25 | 15 | 480 | 7.5 |
| Example 7 | 0.05 | 0.20 | 4 | 600 | 6.8 |
| Example 8 | 0.03 | 0.21 | 7 | 580 | 6.8 |
| Example 9 | 0.20 | 0.35 | 16 | 530 | 8.0 |

Furthermore, a plating layer (metal surface layer 2 of FIG. 1) of thickness 5 μm (Ni—P: 0.3 μm+Ni: 2.7 μm+Au: 2.0 μm) was formed on the surfaces of the aluminum-diamond composites as with Example 1. The resulting plated products were measured as to peel strength, and the plating film was observed after a 1000-cycle heat cycle test of holding for 30 minutes at a temperature of −55° C. at atmospheric pressure and holding for 30 minutes at a temperature of 175° C. The results are shown in Table 4.

TABLE 4

| Type | Peel Strength (kgf/cm) | Surface State after Heat Cycle Test |
|---|---|---|
| Example 6 | 12 | No peeling or cracking |
| Example 7 | 13 | No peeling or cracking |
| Example 8 | 11 | No peeling or cracking |
| Example 9 | 13 | No peeling or cracking |

Examples 10-15 and Comparative Examples 1-3

An aluminum-diamond composite produced according to Example 1 was ultrasonically cleaned before plating, after which plating layers (surface metal layers 2 of FIG. 1) were formed on the surfaces of the aluminum-diamond composite under the conditions shown in Table 5. The resulting plated products were measured as to their peel strength, and subjected to a 1000-cycle heat cycle test of holding for 30 minutes at a temperature of −55° C. at atmospheric pressure and holding for 30 minutes at a temperature of 175° C., after which the plating films were observed. The results are shown in Table 6.

TABLE 5

| Type | Pretreatment Catalyst | Ni—P Alloy Layer (μm) | Ni Layer (μm) | Au Layer (μm) | Ratio between Ni Alloy Layer and Ni Layer |
|---|---|---|---|---|---|
| Example 10 | Zn | 0.1 | 1.0 | 2.0 | 0.10 |
| Example 11 | Zn | 0.1 | 5.0 | 2.0 | 0.02 |
| Example 12 | Zn | 1.0 | 3.3 | 2.0 | 0.30 |
| Example 13 | Zn | 1.0 | 5.0 | 2.0 | 0.20 |
| Example 14 | Zn | 0.3 | 2.7 | 0.05 | 0.11 |
| Example 15 | Zn | 0.3 | 2.7 | 4.0 | 0.11 |
| Comparative Example 1 | Zn | 3.5 | 3.5 | 2.0 | 1.00 |
| Comparative Example 2 | Zn | 5.0 | 0 | 2.0 | — |
| Comparative Example 3 | Pd | 3.5 | 3.5 | 2.0 | 1.00 |

TABLE 6

| Type | Peel Strength (kgf/cm) | Surface State after Heat Cycle Test |
|---|---|---|
| Example 10 | 12 | No peeling or cracking |
| Example 11 | 13 | No peeling or cracking |
| Example 12 | 12 | No peeling or cracking |
| Example 13 | 12 | No peeling or cracking |
| Example 14 | 10 | No peeling or cracking |
| Example 15 | 11 | No peeling or cracking |
| Comparative Example 1 | 12 | Cracking |
| Comparative Example 2 | 12 | Cracking |
| Comparative Example 3 | 3 | Peeling and cracking |

In Examples 10-15, sufficient plating adhesion was able to be ensured by forming an appropriate surface metal layer on the surface of the composite, while also suppressing the generation of cracks in the surface metal layer portion even after a heat cycle test simulating actual use under high duress.

Examples 16-19 and Comparative Example 4

70 wt % of a commercially available high-purity diamond powder A (average particle size 180 μm) was mixed with 30 wt % of a high-purity diamond powder B (average particle size 20 μm).

Next, the diamond powder was loaded into an isotropic graphite jig (mold member 20 of FIG. 4) with a porosity of 20% having external dimensions of 60×60×8 mmt and a hole of 40×40×8 mmt in a central portion, so as to be sandwiched from both sides with a 40×40×3.1 mmt silicon carbide porous body (ceramic porous body 21 of FIG. 4) with a porosity of 35% to form a structure.

A plurality of the above structures were stacked with 60×60×1 mmt mold release plates coated with graphite mold release agent (mold release plate 22 of FIG. 4) in between, iron plates of thickness 12 mm were placed on both sides, and these were attached with six M10 bolts and tightened with a torque wrench to a planar clamping torque of 10 Nm to form a single block.

Next, the resulting block was preheated in an electric furnace to a temperature of 650° C., then placed in a preheated press mold of inner dimensions 300 mm, an aluminum alloy melt of temperature 800° C. comprising 12 mass % silicon and 1 mass % magnesium was poured in, and compressed for 20 minutes at a pressure of 100 MPa to impregnate the diamond powder with aluminum alloy. After cooling to room temperature, the blocks were cut along the shapes of the mold release plates using a wet bandsaw; and the mold release plates were stripped. Then, annealing was performed for three hours at 530° C. in order to remove the strain from impregnation to obtain an aluminum-diamond composite.

The resulting aluminum-diamond composites were polished on both surfaces to the plate thicknesses of Table 5 with a planar polishing plate using #230 diamond abrasive grains, then buffed. In Example 19, both surfaces were polished with #230 diamond abrasive grains, but were not buffed.

Next, they were worked to a shape of 25×25 mm using a laser cutter under conditions of processing speed 50 mm/min to form aluminum-diamond composites.

Cross-sections of the resulting aluminum-diamond composites were observed by factory microscope and the average thicknesses of the covering layers on both surfaces (cover layer 15 consisting of an aluminum-ceramic composite of FIG. 3) were measured. Additionally the surface roughness (Ra) was measured with a surface roughness meter and the flatness was measured by three-dimensional profile measurement. The results are shown in Table 7.

Additionally, samples for measurement of coefficient of thermal expansion (3×2×10 mm) and samples for measurement of thermal conductivity (25×25×2 mmt) were produced by laser machining. The respective samples were used to measure the density (Archimedes' principle), the coefficient of thermal expansion from temperatures of 25° C. to 150° C. using a thermal expansion meter (Seico Electronics TMA300) and the thermal conductivity at 25° C. by laser flash analysis (Rigaku LF/TCM-8510B). The results are shown in Table 7.

TABLE 7

| Type | Plate Thick. (mm) | Covering Layer Thick. (mm) | Surface Rough. Ra (μm) | Flatness (μm) | Thermal Cond. (W/mK) | Coeff. Thermal Expansion (×10⁻⁶/K) |
|---|---|---|---|---|---|---|
| Example 16 | 1.9 | 0.05 | 0.15 | 2 | 570 | 6.9 |
| Example 17 | 2.0 | 0.10 | 0.14 | 1 | 550 | 7.0 |
| Example 18 | 2.2 | 0.20 | 0.16 | 2 | 500 | 7.1 |
| Example 19 | 2.0 | 0.10 | 0.95 | 2 | 550 | 7.0 |
| Comparative Example 4 | 2.0 | 0.10 | 0.15 | 2 | 550 | 7.0 |

Furthermore, after ultrasonically cleaning the above aluminum-diamond composite, an aluminum layer (covering layer 16 of FIG. 3) of thickness 0.5 μm was formed on the surface of the composite by vapor deposition, and a heat treatment was performed for 30 minutes at a temperature of 500° C. in a nitrogen atmosphere. The above aluminum layer was not formed in Comparative Example 4. Next, a plating layer (surface metal layer 14 of FIG. 3) was formed in the same manner as Example 1 on the aluminum-diamond composite having an aluminum layer formed on the surface. The resulting plated products were measured as to their peel strength, and subjected to a 1000-cycle heat cycle test of holding for 30 minutes at a temperature of −55° C. at atmospheric pressure and holding for 30 minutes at a temperature of 175 CC, after which the plating films were observed. The results are shown in Table 8.

TABLE 8

| Type | Peel Strength (kgf/cm) | Surface State after Heat Cycle Test |
|---|---|---|
| Example 16 | 12 | No peeling or cracking |
| Example 17 | 11 | No peeling or cracking |
| Example 18 | 12 | No peeling or cracking |
| Example 19 | 13 | No peeling or cracking |
| Comparative Example 4 | 1[(2)] | Peeling and cracking |

[(2)]The plating had pinholes (unplated portions).

The aluminum-diamond composites according to Examples 16-19 had a high thermal conductivity and a coefficient of thermal expansion close to that of semiconductor elements, and by forming an appropriate surface metal layer on the composite surface, ensured adequate plating adhesion, and was able to suppress the generation of cracks in the surface metal layer portions even after heat cycle tests simulating actual use under high duress.

Examples 20-251

Using the same diamond powder as Example 1, the ceramic fibers (ceramic fiber 32 of FIG. 6) shown in Table 9 were used instead of pure aluminum foil above and below the diamond powder at the time of lamination to form structures.

TABLE 9

| Type | Type of Ceramic Fiber | Ceramic Fiber Content Vf (vol %) | Ceramic Fiber Thickness (mm) |
|---|---|---|---|
| Example 20 | alumina | 5 | 0.1 |
| Example 21 | alumina | 10 | 0.1 |
| Example 22 | alumina | 20 | 0.1 |
| Example 23 | alumina | 10 | 0.05 |
| Example 24 | mullite | 10 | 0.2 |
| Example 25 | graphite | 10 | 0.1 |

A plurality of the above structures were stacked with 60×60×1 mmt mold release plates coated with graphite mold release agent (mold release plate 33 of FIG. 6) in between, iron plates of thickness 12 mm were placed on both sides, and these were attached with six M10 bolts and tightened with a torque wrench to a planar damping torque of 10 Nm to form a single block.

Next, the resulting block was preheated in an electric furnace to a temperature of 700° C., then placed in a preheated press mold of inner dimensions 300 mm, an aluminum alloy melt of temperature 850° C. comprising 1 mass % magnesium was poured in, and compressed for 20 minutes at a pressure of 100 MPa to impregnate the diamond powder with aluminum alloy. After cooling to room temperature, the blocks were cut along the shapes of the mold release plates using a wet bandsaw, and the mold release plates were stripped. Then, annealing was performed for three hours at 530° C. in order to remove the strain from impregnation to obtain an aluminum-diamond composite.

The resulting aluminum-diamond composites were machined to dimensions of 25×25×2 mmt by performing the same polishing and working as Example 1, to form aluminum-diamond composites, and cross-sections of the aluminum-diamond composites were observed through a factory microscope to measure the average thickness of the covering layers on both sides (covering layer 27 consisting of an aluminum-ceramic fiber composite layer in FIG. 5), the surface roughness (Ra) measured with a surface roughness meter, and the flatness measured by a three-dimensional profile measuring device. The results are shown in Table 10.

Additionally, the resulting aluminum-diamond composites were subjected to the same property evaluations as Example 1, and the results are shown in Table 10.

TABLE 10

| Type | Plate Thick. (mm) | Covering Layer Thick. (mm) | Surface Rough. Ra (μm) | Flatness (μm) | Thermal Cond. (W/mK) | Coeff. Thermal Expansion (×10⁻⁶/K) |
|---|---|---|---|---|---|---|
| Example 20 | 2.0 | 0.10 | 0.28 | 12 | 560 | 7.2 |
| Example 21 | 2.0 | 0.10 | 0.31 | 11 | 550 | 7.1 |
| Example 22 | 2.0 | 0.10 | 0.30 | 12 | 550 | 7.1 |
| Example 23 | 1.9 | 0.05 | 0.33 | 9 | 570 | 7.0 |
| Example 24 | 2.2 | 0.20 | 0.27 | 18 | 530 | 7.5 |
| Example 25 | 2.0 | 0.10 | 0.36 | 15 | 570 | 7.0 |

Additionally, a plating layer (metal surface layer 25 of FIG. 5) of thickness 5 μm (Ni—P: 0.3 μm+Ni 2.7 μm+Au: 2.0 μm) was formed on the surfaces of the aluminum-diamond composite as with Example 1. The resulting plated products were measured as to their peel strength, and subjected to a 1000-cycle heat cycle test of holding for 30 minutes at a temperature of −55° C. at atmospheric pressure and holding for 30 minutes at a temperature of 175° C., after which the plating films were observed. The results are shown in Table 11.

TABLE 11

| Type | Peel Strength (kgf/cm) | Surface State after Heat Cycle Test |
|---|---|---|
| Example 20 | 11 | No peeling or cracking |
| Example 21 | 10 | No peeling or cracking |
| Example 22 | 11 | No peeling or cracking |
| Example 23 | 10 | No peeling or cracking |
| Example 24 | 11 | No peeling or cracking |
| Example 25 | 10 | Peeling and cracking |

The aluminum-diamond composites according to Examples 20-25 had a high thermal conductivity and a coefficient of thermal expansion close to that of semiconductor elements, and by forming an appropriate surface metal layer on the composite surface, ensured adequate plating adhesion, and was able to suppress the generation of cracks in the surface metal layer portions even after heat cycle tests simulating actual use under high duress

DESCRIPTION OF THE REFERENCE NUMBERS

1 aluminum-diamond composite
2 surface metal layer
3 composited portion
4 covering layer
5 Ni alloy layer
6 Ni layer
7 Au layer
8 mold member consisting of porous body
9 mold release plate coated with mold release agent
10 diamond powder
11 metal plate
12 aluminum-diamond composite
13 surface metal layer
14 composited portion
15 covering layer (aluminum-diamond composite)
16 covering layer (metal layer)
17 Ni alloy layer
18 Ni layer
19 Au layer
20 mold member consisting of porous body
21 ceramic porous body
22 mold release plate coated with mold release agent
23 diamond powder
24 aluminum-diamond composite
25 surface metal layer
26 composited portion
27 covering layer (aluminum-ceramic fiber composite layer)
28 Ni alloy layer
29 Ni layer
30 Au layer
31 mold member consisting of porous body
32 ceramic fiber
33 mold release plate coated with mold release agent
34 diamond powder
35 metal plate

The invention claimed is:

1. A heat dissipating component for a semiconductor element, comprising
an aluminum-diamond composite formed by covering both main faces of a plate-shaped body of thickness 0.4 to 6 mm comprising 40 vol % to 70 vol % diamond particles, the balance consisting of a metal having aluminum as a main component, with a covering layer consisting of a metal having aluminum as a main component or an aluminum-ceramic composite material;
wherein (1) an amorphous Ni alloy layer of film thickness 0.1 to 1 μm, (2) a Ni layer of film thickness 1 to 5 μm, and (3) an Au layer of film thickness 0.05 to 4 μm are formed, sequentially from a main face side, on both main faces of the aluminum-diamond composite, such that a ratio between the Ni alloy layer and the Ni layer (Ni alloy layer thickness/Ni layer thickness) is 0.3 or less.

2. The heat dissipating component of claim 1, wherein the covering layer is a metal layer of film thickness 0.03 to 0.2 mm comprising at least 80 vol % of a metal having aluminum as a main component.

3. The heat dissipating component of claim 1, wherein the covering layer is a layer comprising, from a plate-shaped body side, an aluminum-ceramic composite layer of film thickness 0.05 to 0.2 mm, and a metal layer of film thickness 0.1 to 2 μm, having aluminum as a main component.

4. The heat dissipating component of claim 1, wherein the covering layer is an aluminum-ceramic fiber composite layer of film thickness 0.05 to 0.2 mm comprising at least 80 vol % of a metal having aluminum as a main component.

5. The heat dissipating component of any one of claims 1 to 4, wherein the Ni alloy layer, Ni layer and Au layer are formed by plating, the underlying Ni alloy layer is formed by electroless plating pre-treated by zinc substitution, and the peel strength of the plating film is at least 5 kg/cm.

6. The heat dissipating element of any one of claims 1 to 4, wherein the semiconductor element is an RF element or semiconductor laser element consisting of GaN, GaAs or SiC.

7. The heat dissipating element of any one of claims 1 to 4, wherein the aluminum-diamond composite is produced by squeeze casting.

8. The heat dissipating element of claim 1 or 2, wherein the aluminum-diamond composite has a thermal conductivity at 25° C. of at least 400 W/mK and a coefficient of thermal expansion from 25° C. to 150° C. of $5 \times 10^{-6}$ to $10 \times 10^{-6}$/K.

9. The heat dissipating element of claim 1 or 2, wherein the aluminum-diamond composite is an aluminum-diamond composite in which the diamond particles are characterized by the presence of a layer of β-type silicon carbide chemically bonded to a surface thereof.

* * * * *